(12) United States Patent
Nakamura et al.

(10) Patent No.: US 9,279,729 B2
(45) Date of Patent: Mar. 8, 2016

(54) INFRARED SENSOR

(75) Inventors: Kenzo Nakamura, Naka (JP);
Mototaka Ishikawa, Naka (JP); Gakuji Uozumi, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 72 days.

(21) Appl. No.: 14/003,743

(22) PCT Filed: Mar. 21, 2012

(86) PCT No.: PCT/JP2012/001916
§ 371 (c)(1),
(2), (4) Date: Nov. 22, 2013

(87) PCT Pub. No.: WO2012/132316
PCT Pub. Date: Oct. 4, 2012

(65) Prior Publication Data
US 2014/0061468 A1 Mar. 6, 2014

(30) Foreign Application Priority Data

Mar. 30, 2011 (JP) .................................. 2011-076767

(51) Int. Cl.
*G01J 5/02* (2006.01)
*G01J 5/10* (2006.01)
*G01J 5/20* (2006.01)
(Continued)

(52) U.S. Cl.
CPC ................. *G01J 5/10* (2013.01); *G01J 5/0215* (2013.01); *G01J 5/20* (2013.01); *G01J 2005/067* (2013.01); *H01L 37/02* (2013.01)

(58) Field of Classification Search
CPC ........... H05K 2201/2009; G01J 5/0215; G01J 5/0096; G01J 5/10; G01J 2005/067; G01J 5/02; H01J 37/02
See application file for complete search history.

(56) References Cited

U.S. PATENT DOCUMENTS

| 5,105,084 A * | 4/1992 | Nagai et al. ................. 250/338.3 |
| 2009/0116201 A1* | 5/2009 | Hsieh ............................ 361/736 |
| 2014/0010262 A1* | 1/2014 | Nakamura et al. ............ 374/121 |

FOREIGN PATENT DOCUMENTS

| CN | 1428599 A | 7/2003 |
| JP | 2000331577 A | 11/2000 |

(Continued)

OTHER PUBLICATIONS

JP2011-13213A machine translation.*
(Continued)

*Primary Examiner* — David Porta
*Assistant Examiner* — Hugh H Maupin
(74) *Attorney, Agent, or Firm* — Locke Lord LLP

(57) ABSTRACT

A lightweight infrared sensor which is readily and stably erected to a substrate, the infrared sensor includes an insulating film; a first and second heat sensitive element are disposed on one surface of the insulating film separately; a first and second conductive film on one surface of the insulating film and are respectively connected to the first and the second heat sensitive element; an infrared reflection film on the other surface of the insulating film so as to face the second heat sensitive element; a reinforcing plate on which a sensor part window corresponding to a sensor part is formed and which is adhered to the insulating film; and a first and a second terminal electrode are respectively connected to the first and the second wiring film and formed on the edge of the insulating film.

3 Claims, 6 Drawing Sheets

(51) Int. Cl.
*G01J 5/06* (2006.01)
*H01L 37/02* (2006.01)

(56) References Cited

FOREIGN PATENT DOCUMENTS

| JP | 2003-194630 A | 7/2003 |
|---|---|---|
| JP | 2004-061283 A | 2/2004 |
| JP | 2005-268404 A | 9/2005 |
| JP | 2006-228768 A | 8/2006 |
| JP | 2011-013213 A | 1/2011 |
| TW | 201013892 A | 4/2010 |
| TW | I336394 B | 1/2011 |
| WO | WO-2011046163 A1 | 4/2011 |
| WO | WO-2011078004 A1 | 6/2011 |

OTHER PUBLICATIONS

Supplementary European Search Report dated Aug. 25, 2014 for Ep. Appln. No. 12764040.7.
International Search Report of PCT/JP2012/001916.
Notice of Refusal for Taiwan Patent Application No. 101110805 dated Sep. 7, 2015.

* cited by examiner (a)   (b)

(a)   (b)

INFRARED SENSOR

CROSS-REFERENCE TO RELATED APPLICATIONS

This application is a U.S. National stage application of PCT International Application No. PCT/JP2012/001916 filed Mar. 21, 2012, which claims the benefit of Japanese Patent Application No. 2011-076767 filed Mar. 30, 2011, the entire contents of the aforementioned applications are hereby incorporated herein by reference.

BACKGROUND OF THE INVENTION

1. Field of the Invention

The present invention relates to an infrared sensor that detects infrared radiation from a measurement object to thereby measure the temperature or the like of the measurement object.

2. Description of the Related Art

When the heat generation state of an electronic component (device) on a circuit substrate, such as a switching element such as FET, an electrolytic capacitor, or the like, is detected, there has been known a method in which a temperature sensor is provided on a circuit substrate in the vicinity of the device or a temperature sensor is provided in a heat sink connected to the device so as to indirectly know an element temperature from the temperature of the circuit substrate or the heat sink. In the method, the temperature of a measurement object such as a device or the like is indirectly detected, resulting in an increase in detection errors and difficulty in highly accurate detection.

Conventionally, infrared sensors have been used as temperature sensors that detect infrared radiation emitted from a measurement object without contact to thereby measure the temperature of the measurement object.

For example, Patent Document 1 discloses an infrared sensor that is a temperature sensor for measuring the temperature of a heating fixing roller or the like used in a fixing device for a copier and that includes a resin film that is disposed on a holder, a heat sensitive element for infrared detection that is provided on the resin film and detects infrared radiation via a light guide unit of the holder, and a heat sensitive element for temperature compensation that is provided on the resin film in a light-shielding state and detects the temperature of the holder. In the infrared sensor, an infrared absorbing film is formed on the inside surface of the light guide unit and an infrared absorbing material such as carbon black or the like is contained in the resin film so as to increase infrared absorption. Also, in the infrared sensor, the heat sensitive element is built into the holder which is a housing of a substantially block shape formed from a metal material such as aluminum having high heat conductivity and low thermal emissivity.

Also, Patent Document 2 discloses an infrared detector including a heat sensitive element for infrared detection, a heat sensitive element for temperature compensation, a resin film on which the heat sensitive element for infrared detection and the heat sensitive element for temperature compensation are fixed in a tight contact manner, and a case having a frame body in which the heat sensitive element for infrared detection is arranged on the side of an entrance window for infrared radiation and the heat sensitive element for temperature compensation is arranged on the side of a shielding unit for shielding infrared radiation. In the infrared detector, an infrared absorbing material such as carbon black or the like is contained in the resin film so as to increase infrared absorption and the frame body is formed with a material having excellent heat conductivity in order to eliminate the thermal gradient between the heat sensitive element for infrared detection and the heat sensitive element for temperature compensation. For the heat sensitive element for infrared detection and the heat sensitive element for temperature compensation, a radial lead thermistor in which a lead wire is in connection with a thermistor is employed. Furthermore, in the infrared detector, heat sensitive elements are built into the case formed of a resin or a metal.

These infrared sensors disclosed in Patent Documents 1 and 2 employ a structure in which an infrared absorbing material such as carbon black or the like is contained in the resin film and one of the heat sensitive elements is shielded from light so as to provide temperature compensation. However, the resin film containing an infrared absorbing material exhibits high heat conductivity and thus it becomes difficult to cause the temperature difference between the heat sensitive element for infrared detection and the heat sensitive element for temperature compensation. In addition, in order to increase the temperature difference between these heat sensitive elements, the distance between these heat sensitive elements needs to be spaced apart from each other, resulting in an increase in the overall shape of the infrared sensor and a difficulty in achieving size reduction of the same. Furthermore, the structure for shielding the heat sensitive element for temperature compensation from light needs to be provided on the case itself, which makes the infrared sensor more expensive.

In Patent Document 2, the frame body having excellent heat conductivity is employed, and thus, heat supplied from the infrared absorbing film is also dissipated, resulting in degradation in sensitivity. In addition, since a radial lead thermistor in which a lead wire is in connection with a thermistor is employed, heat conduction through a space occurs between the thermistor and the lead wire.

Furthermore, although the infrared sensor disclosed in Patent Document 2 employs a structure in which one of the heat sensitive elements is shielded from infrared radiation with the housing, the shielding portion of the case which only blocks infrared radiation absorbs infrared radiation, resulting in changes in the temperature of the shielding portion. Consequently, the heat sensitive element for temperature compensation is inappropriate for use as a reference.

Thus, as disclosed in Patent Document 3, there has been developed an infrared sensor that includes an insulating film, a first heat sensitive element and a second heat sensitive element that are disposed on one surface of the insulating film so as to be separated apart from one another, a plurality pairs of conductive wiring films that are formed on one surface of the an insulating film and are separately connected to the first heat sensitive element and the second heat sensitive element, an infrared absorbing film that is disposed on the other surface of the insulating film so as to face the first heat sensitive element, and an infrared reflection film that is disposed on the other surface of the insulating film so as to face the second heat sensitive element.

In the infrared sensor, a portion at which the infrared absorbing film is provided absorbs infrared radiation and a portion at which the infrared reflection film is provided reflects infrared radiation, so that a favorable temperature difference can be obtained between the first heat sensitive element and the second heat sensitive element on a thin insulating film having low heat conductivity. Specifically, even in the case of the insulating film having low heat conductivity without containing an infrared absorbing material or the like, the heat generated by infrared absorption can be conducted only to a portion immediately above the first heat sensitive element on the insulating film. In particular, the heat conduction from the infrared absorbing film is performed through the thin insulating film, resulting in no degradation in sensitivity and obtaining high responsiveness. Since the area of the infrared absorbing film can be arbitrarily set, a viewing angle for infrared detection can be set by area in accordance with the distance to the measurement object, resulting in obtaining high light receiving efficiency. Also, the infrared reflection film reflects infrared radiation directed toward a portion immediately above the second heat sensitive element on the insulating film so that infrared absorption can be prevented. It should be noted that since the infrared absorbing film and the infrared reflection film are formed on the insulating film, a medium of heat conduction between the infrared absorbing film and the infrared reflection film is only the insulating film on which these films are opposed to one another other than air, resulting in a reduction in cross-sectional area for heat conduction. Thus, heat is difficult to be conducted to the heat sensitive elements which are opposed to one another so that heat interference is reduced, resulting in an improvement in detection sensitivity. As described above, the infrared sensor has a structure in which the first heat sensitive element and the second heat sensitive element, for which the effects of heat are suppressed from one another, on the insulating film having low heat conductivity, measure the partial temperature of the insulating film directly below the infrared absorbing film and directly below the infrared reflection film, respectively. Thus, a favorable temperature difference can be obtained between the first heat sensitive element for infrared detection and the second heat sensitive element for temperature compensation, resulting in an increase in sensitivity.

PRIOR ART DOCUMENTS

Patent Documents

[Patent Document 1] Japanese Unexamined Patent Application Publication No. 2002-156284 (Paragraph [0026], FIG. 2)
[Patent Document 2] Japanese Unexamined Patent Application Publication No. 7-260579 (Claims, FIG. 2)
[Patent Document 3] Japanese Unexamined Patent Application Publication No. 2011-13213 (Claims, FIG. 1)

SUMMARY OF THE INVENTION

Problems to be Solved by the Invention

However, the following problems still remain in the conventional techniques described above.

In the case of the attachment of the infrared sensor disclosed in Patent Documents 1 to 3, dedicated large attaching structure and supporting structure need to be employed for attaching a housing or a case of a block shape. Consequently, a large installation space must be ensured, resulting in higher costs.

For example, as shown in FIG. 7, it is also contemplated that a thermopile (101) serving as an infrared sensor is fixed to a mounting substrate (102) standing perpendicularly so as to detect a temperature from the lateral direction of the device. In this case, the infrared sensor has a structure where the thermopile (101) is sealed into a metal can, resulting in a large volume and an increase in thickness. Consequently, a large area and a installation space may undesirably be needed as in Patent Documents described above. Thus, it becomes difficult to reduce the size of the entire device or the entire circuit substrate on which the infrared sensor is mounted and to achieve high-density packaging thereof. In addition, since the thermopile (101) is heavy, high support strength needs to be obtained by a support structure such as a large support member (103) or the like in order to stand the mounting substrate (102) perpendicularly to a circuit substrate (104). Furthermore, the thermopile (101) needs to be soldered, resulting in an increase in attaching steps and an increase in costs.

The present invention has been made in view of the aforementioned circumstances, and an object of the present invention is to provide an infrared sensor which is lightweight and is readily attached to a substrate with sufficient support strength so as to be erected thereon.

Means for Solving the Problems

The present invention adopts the following structure in order to solve the aforementioned problems. Specifically, an infrared sensor according to a first aspect of the present invention is characterized in that the infrared sensor includes an insulating film; a first heat sensitive element and a second heat sensitive element that are disposed on one surface of the insulating film so as to be separated apart from one another; a first conductive wiring film and a second conductive wiring film that are formed on one surface of the insulating film and are respectively connected to the first heat sensitive element and the second heat sensitive element; an infrared reflection film that is disposed on the other surface of the insulating film so as to face the second heat sensitive element; a reinforcing plate on which a sensor part window corresponding to the region of the first heat sensitive element, the second heat sensitive element, and the infrared reflection film is formed and which is adhered to one surface of the insulating film; and a plurality of terminal electrodes that are respectively connected to the first wiring film and the second wiring film, are formed on the edge of the other surface of the insulating film, and are capable of being fitted into an external connector.

Since the infrared sensor includes a reinforcing plate on which a sensor part window corresponding to the region of the first heat sensitive element, the second heat sensitive element, and the infrared reflection film is formed and which is adhered to one surface of the insulating film; and a plurality of terminal electrodes that are respectively connected to the first wiring film and the second wiring film, are formed on the edge of the other surface of the insulating film, and are capable of being fitted into an external connector, the insulating film is supported by the reinforcing plate and the entire infrared sensor is of a lightweight plate. In addition, the terminal electrodes are fit into the connector, so that electrical connection can be readily established and the infrared sensor can be erected on a circuit substrate or the like with sufficient support strength. Thus, the infrared sensor is readily mountable by inserting it into the connector mounted by reflow soldering on the circuit substrate, is also mountable in a small installation space, and is suitable for achieving high-density packaging thereof. It should be noted that since the sensor part window is hollowed out within the reinforcing plate so as to provide space to the sensor part, the reinforcing plate does not obstruct mounting of the first heat sensitive element and the second heat sensitive element and the sensor part is suppressed from being affected by the effects of heat conduction from the reinforcing plate.

An infrared sensor according to a second aspect of the present invention is characterized in that a sealing member for sealing the sensor part window is adhered to the reinforcing plate according to the first aspect of the present invention.

Specifically, since, in the infrared sensor, a sealing member for sealing the sensor part window is adhered to the reinforcing plate, the sensor part may be covered with the space provided by the sealing member so that the effects of air convection and infrared radiation from the back surface of the infrared sensor may be reduced.

An infrared sensor according to a third aspect of the present invention is characterized in that the infrared sensor includes a circuit part that is formed on the insulating film and a circuit part window corresponding to the circuit part is formed in the reinforcing plate according to the first or the second aspect of the present invention.

Specifically, since the infrared sensor includes a circuit part that is formed on the insulating film and a circuit part window corresponding to the circuit part is formed in the reinforcing plate, the sensor part and a circuit part which is a control circuit for the same or the like are integrally formed on the same film, resulting in a reduction in size and costs of the entire device. A space is formed by the circuit part window in a region corresponding to the circuit part so that the reinforcing plate does not obstruct mounting of an electronic component such as an operation amplifier or the like.

An infrared sensor according to a fourth aspect of the present invention is characterized in that the first wiring film is arranged around the first heat sensitive element and is formed to have a larger area than that of the second wiring film according to any one of the first to third aspects of the present invention.

Specifically, since, in the infrared sensor, the first wiring film is arranged around the first heat sensitive element and is formed to have a larger area than that of the second wiring film, the first wiring film improves heat collection from a portion of the insulating film at which infrared radiation has been absorbed and a heat capacity of the first wiring film becomes close to that of a portion in which the infrared reflection film is formed on the insulating film, resulting in a reduction in variation error. It is preferable that the area and the shape of the first wiring film are set such that the heat capacity of the first wiring film is substantially the same as that of a portion in which the infrared reflection film is formed on the insulating film.

Effects of the Invention

According to the present invention, the following effects may be provided.

Specifically, since the infrared sensor of the present invention includes a reinforcing plate on which a sensor part window is formed and which is adhered to one surface of the insulating film; and a plurality of terminal electrodes that are respectively connected to the first wiring film and the second wiring film, are formed on the edge of the other surface of the insulating film, and are capable of being fitted into an external connector, the infrared sensor (1) is readily mountable in an erected state only by inserting the one end of the infrared sensor (1) at which the terminal electrodes are formed into the connector, is also mountable in a small installation space, and is suitable for achieving high-density packaging thereof.

BEST MODES FOR CARRYING OUT THE INVENTION

Figure 1:
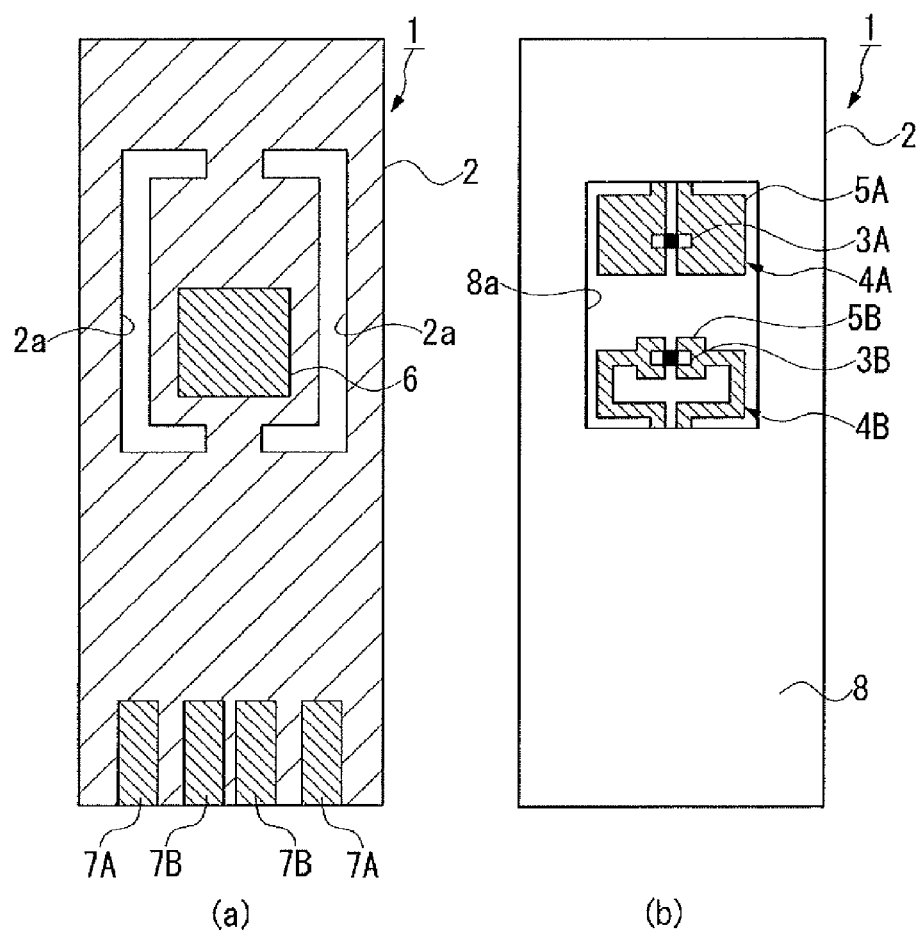
FIG. 1(a) is a front view illustrating an infrared sensor according to a first embodiment of the present invention.
FIG. 1(b) is a rear view illustrating the infrared sensor according to the first embodiment of the present invention.

Hereinafter, a description will be given of an infrared sensor according to a first embodiment of the present invention with reference to FIGS. 1 to 5. In the drawings used in the following description, the scale of each component is changed as appropriate so that each component is recognizable or is readily recognized.

As shown in FIGS. 1 to 4, the infrared sensor (1) of the present embodiment includes an insulating film (2); a first heat sensitive element (3A) and a second heat sensitive element (3B) that are disposed on one surface of the insulating film (2) so as to be separated apart from one another; a pair of first conductive wiring films (4A) serving as conductive metal films that are formed on one surface of the insulating film (2) and are connected to the first heat sensitive element (3A) and a pair of second conductive wiring films (4B) serving as conductive metal films that are connected to the second heat sensitive element (3B); an infrared reflection film (6) that is disposed on the other surface of the insulating film (2) so as to face the second heat sensitive element (3B); a reinforcing plate (8) on which a sensor part window (8a) corresponding to the region (hereinafter referred to as "sensor part") of the first heat sensitive element (3A), the second heat sensitive element (3B), and the infrared reflection film (6) is formed and which is adhered to one surface of the insulating film (2); and first terminal electrodes (7A) and second terminal electrodes (7B) that are respectively connected to the first wiring films (4A) and the second wiring films (4B), are formed on the edge of the other surface of the insulating film (2), and are capable of being fitted into an external connector (9).

As shown in FIG. 5(a), the pair of first wiring films (4A) have a pair of first adhesion electrodes (5A) formed on the insulating film (2) on one end thereof and are connected to a pair of first terminal electrodes (7A) formed on the opposite surface (the other surface) of the insulating film (2) on the other end of the infrared sensor via a through hole (not shown).

Also, the pair of second wiring films (4B) have a pair of second adhesion electrodes (5B) formed on the insulating film (2) on one end thereof and are connected to a pair of second terminal electrodes (7B) formed on the opposite surface (the other surface) of the insulating film (2) on the other end of the infrared sensor via a through hole (not shown).

The pair of first adhesion electrodes (5A) are arranged around the first heat sensitive element (3A) and is formed to have a larger area than that of the second adhesion electrodes (5B). These first adhesion electrodes (5A) have the first heat sensitive element (3A) that is arranged substantially at the center of the pair of the electrodes (5A) and are set to have substantially the same area as that of the infrared reflection film (6). Specifically, the first adhesion electrodes (5A) are set to have substantially the same heat capacity as that of a portion in which the infrared reflection film (6) is formed on the insulating film (2).

Note that the terminal electrodes (3a) of the first heat sensitive element (3A) and the second heat sensitive element (3B) are adhered to the first adhesion electrodes (5A) and the second adhesion electrodes (5B), respectively, via a conductive adhesive such as solder.

The insulating film (2) is formed of a polyimide resin sheet. The infrared reflection film (6), the first wiring films (4A), the second wiring films (4B), the first terminal electrodes (7A), and the second terminal electrodes (7B) are formed by copper foil. Specifically, a double-sided flexible substrate is produced such that copper foil electrodes serving as the infrared reflection film (6), the first wiring films (4A), and the second wiring films (4B) are pattern-formed on both sides of the polyimide substrate serving as the insulating film (2).

The insulating film (2) is provided with a pair of elongated holes (2a) that extend so as to avoid the first wiring films (4A) and the second wiring films (4B) on the periphery of the first heat sensitive element (3A) and the second heat sensitive element (3B). These elongated holes (2a) are grooves that are opposite one another and are hollowed out in a squared U-shape, and the region formed therebetween is a central mounting region on which the first heat sensitive element (3A) and the second heat sensitive element (3B) are mounted and on which the first wiring films (4A), the second wiring films (4B), and the infrared reflection film (6) are formed. The region between the ends of the pair of elongated holes (2a) which are opposite one another is a wiring region through which the first wiring films (4A) and the second wiring films (4B) pass and also serve as the support for the central mounting region.

Furthermore, as shown in FIG. 1(a), the infrared reflection film (6) is arranged in a square shape immediately above the second heat sensitive element (3B) and is constituted by a copper foil and a gold-plated film deposited on the copper foil. In this case, the gold-plated film functions as an antioxidant film for the copper foil and improves infrared reflectivity. Note that a polyimide resin coverlay (not shown) that covers the entire surface including the first wiring films (4A) and the second wiring films (4B) and excluding the first terminal electrodes (7A) and the second terminal electrodes (7B) is formed on the back surface of the insulating film (2).

The infrared reflection film (6) is formed of a material having higher infrared reflectivity than that of the insulating film (2) and is constituted by a copper foil and a gold-plated film deposited on the copper foil as described above. Instead of the gold-plated film, a mirror finished aluminum vapor-deposited film, an aluminum foil, or the like may also be deposited on the copper foil. The infrared reflection film (6) has a larger size than that of the second heat sensitive element (3B) so as to cover the second heat sensitive element (3B).

Figure 2:
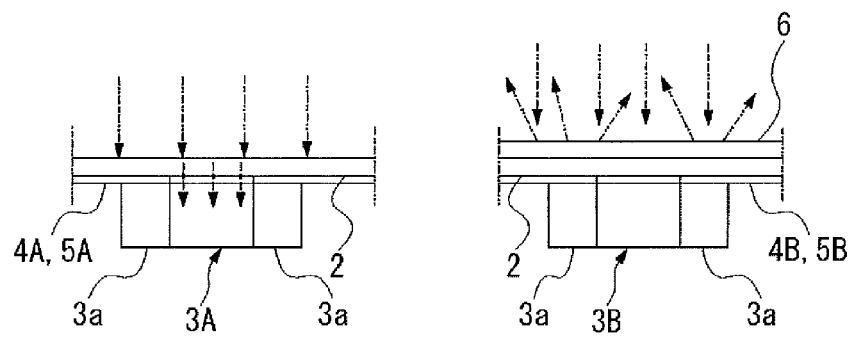
FIG. 2(a) is an enlarged front view illustrating essential parts of a portion with the first heat sensitive element adhered thereto according to the first embodiment.
FIG. 2(b) is an enlarged front view illustrating essential parts of a portion with the second heat sensitive element adhered thereto according to the first embodiment.

As shown in FIG. 2, each of the first heat sensitive element (3A) and the second heat sensitive element (3B) is a chip thermistor in which the terminal electrode (3a) is formed on both ends thereof. Examples of such a thermistor includes an NTC type thermistor, a PTC type thermistor, a CTR type thermistor, and the like. In the present embodiment, an NTC type thermistor is employed as each of the first heat sensitive element (3A) and the second heat sensitive element (3B). The thermistor is formed of a thermistor material such as a Mn—Co—Cu-based material, a Mn—Co—Fe-based material, or the like. The first heat sensitive element (3A) and the second heat sensitive element (3B) are mounted on the insulating film (2) by bonding the terminal electrodes (3a) to the first adhesion electrode (5A) and the second adhesion electrode (5B) corresponding to the first heat sensitive element (3A) and the second heat sensitive element (3B), respectively.

In particular, in the present embodiment, a ceramic sintered body containing Mn, Co and Fe metal oxides, i.e., a thermistor element formed of a Mn—Co—Fe-based material is employed as the first heat sensitive element (3A) and the second heat sensitive element (3B). Furthermore, it is preferable that the ceramic sintered body has a crystal structure in which the main phase is a cubic spinel phase. In particular, it is most preferable that the ceramic sintered body has a crystal structure having a single phase consisting of a cubic spinel phase. The reason why a crystal structure in which the main phase is a cubic spinel phase is employed as the ceramic sintered body is because the cubic spinel phase has no anisotropy and has no impurity layer and thus the variation in electric characteristic is small within the ceramic sintered body so that highly accurate measurement can be achieved by the first heat sensitive element (3A) and the second heat sensitive element (3B). The ceramic sintered body has such a stable crystal structure, resulting in improved reliability for resistance to environment.

The reinforcing plate (8) is formed of an insulating rigid resin substrate such as a glass epoxy substrate or the like. As shown in FIG. 5(b), the sensor part window (8a) of rectangular shape corresponding to the sensor part is formed in the reinforcing plate (8). The sensor part window (8a) is formed on the inside of the pair of elongated holes (2a) and is formed so as to surround the first adhesion electrodes (5A) and the second adhesion electrodes (5B).

As shown in FIG. 5(c), a sealing member (10) for sealing the sensor part window (8a) is adhered to the back surface of the reinforcing plate (8). It is preferable that the sealing member (10) can reflect infrared radiation from the outside. As the sealing member (10), the same film as the infrared reflection film (6), an aluminum foil, or the like may also be employed.

Figure 3:
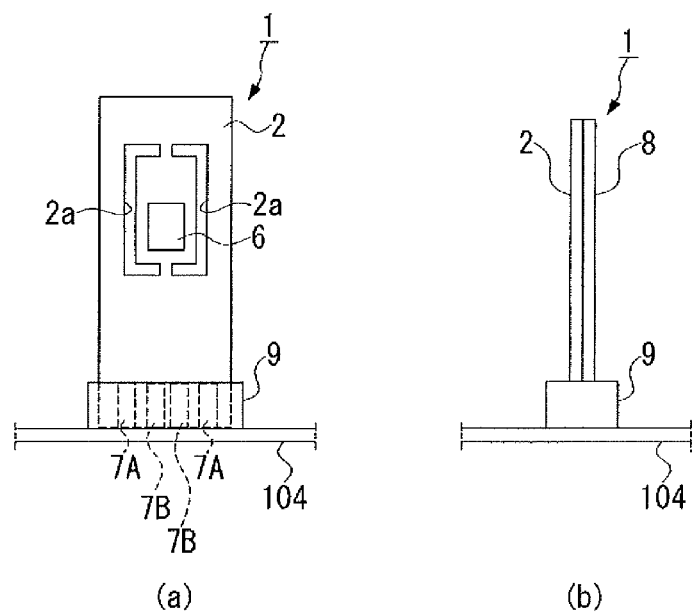
FIG. 3(a) is a front view illustrating the infrared sensor of the first embodiment which is mounted on a connector on a substrate.
FIG. 3(b) is a side view illustrating the infrared sensor of the first embodiment which is mounted on a connector on a substrate.
Figure 4:
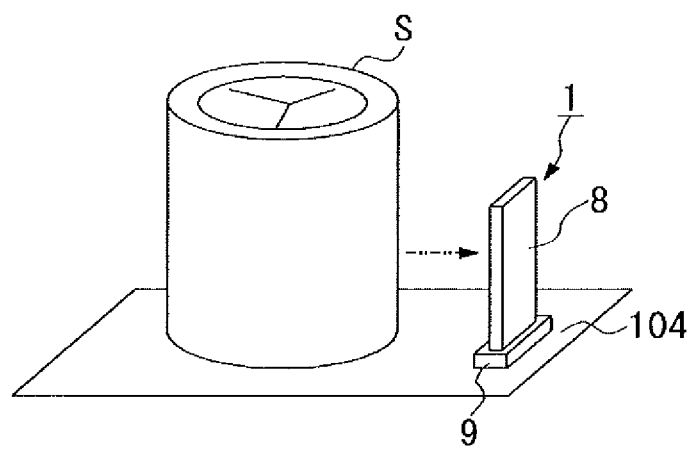
FIG. 4 is a perspective view illustrating a positional relationship between a measurement object on a substrate and an infrared sensor mounted to a connector according to the first embodiment.
Figure 5:
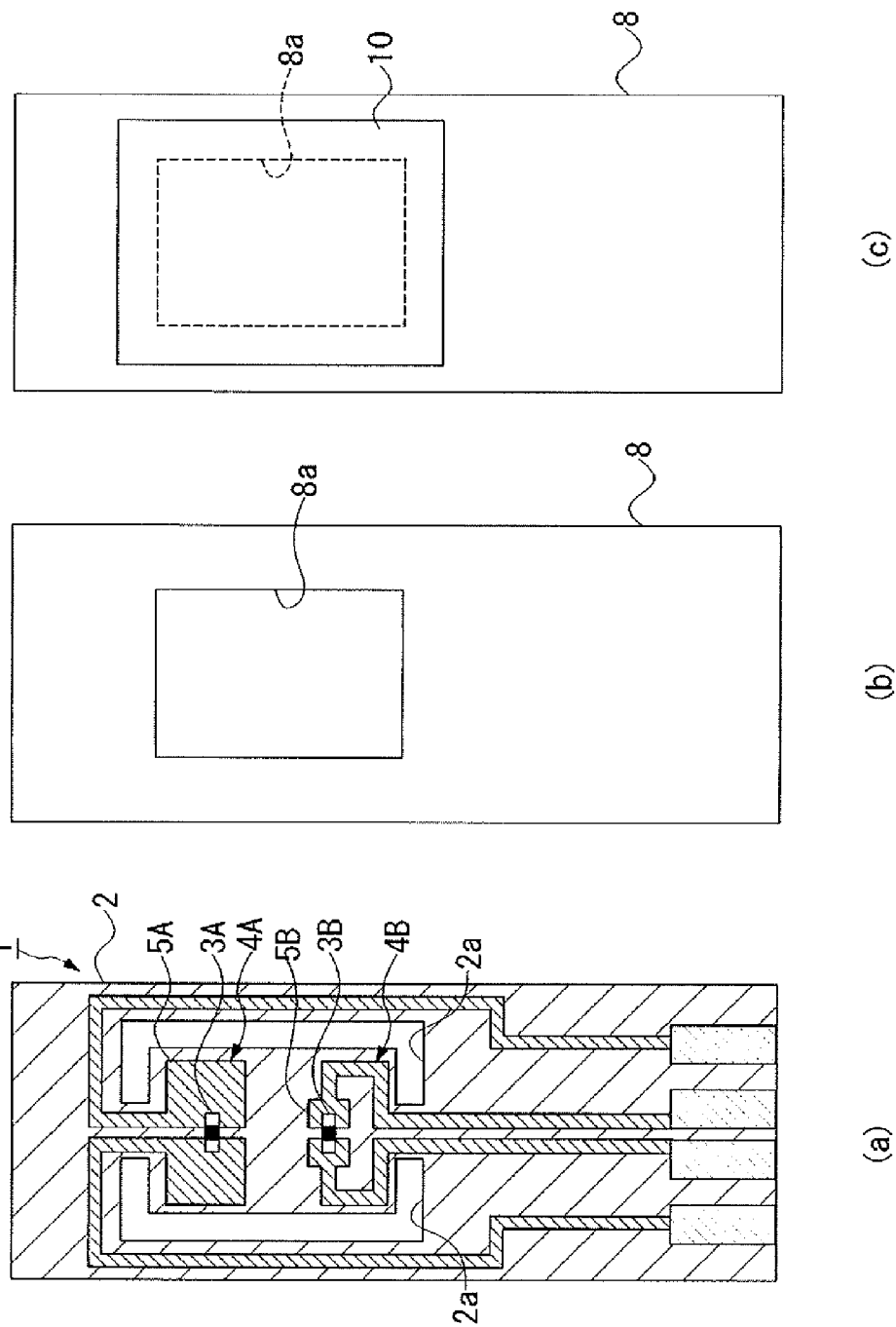
FIG. 5(a) is a rear view illustrating the infrared sensor of the first embodiment with a reinforcing plate being removed therefrom.
FIG. 5(b) is a rear view illustrating the reinforcing plate.
FIG. 5(c) is a rear view illustrating the reinforcing plate with a sealing member adhered thereto.

As shown in FIG. 3, the infrared sensor (1) is mounted such that the end on the side of the first terminal electrodes (7A) and the second terminal electrodes (7B) is inserted into the connector (9) on the circuit substrate (104). As shown in FIG. 4, the other surface of the insulating film (2), i.e., the surface on which the infrared reflection film (6) is formed is directed toward the measurement object S such as an electrolytic capacitor, a switching element, or the like.

As described above, since the infrared sensor (1) of the present embodiment includes the reinforcing plate (8) on which the sensor part window (8a) corresponding to the region of the first heat sensitive element (3A), the second heat sensitive element (3B), and the infrared reflection film (6) is formed and which is adhered to one surface of the insulating film (2); and the first terminal electrodes (7A) and the second terminal electrodes (7B) that are respectively connected to the first wiring films (4A) and the second wiring films (4B), are formed on the edge of the other surface of the insulating film (2), and are capable of being fitted into the external connector (9), the insulating film (2) is supported by the reinforcing plate (8) and the entire infrared sensor (1) is of a lightweight plate. In addition, the first terminal electrodes (7A) and the second terminal electrodes (7B) are fit into the connector (9), so that electrical connection can be readily established and the infrared sensor (1) can be erected on the circuit substrate (104) with sufficient support strength.

Thus, the infrared sensor (1) is readily mountable by inserting it into the connector (9) mounted by reflow soldering on the circuit substrate (104), is also mountable in a small installation space, and is suitable for achieving high-density packaging thereof. It should be noted that since the sensor part window (8a) is hollowed out within the reinforcing plate (8) so as to provide space to the sensor part, the reinforcing plate (8) does not obstruct mounting of the first heat sensitive element (3A) and the second heat sensitive element (3B) and the sensor part is suppressed from being affected by the effects of heat conduction from the reinforcing plate (8).

Since the sealing member (10) for sealing the sensor part window (8a) is adhered to the reinforcing plate (8), the sensor part may be covered with the space provided by the sealing member (10) so that the effects of air convection and infrared radiation from the back surface of the infrared sensor (1) may be reduced.

Since the insulating film (2) is provided with a pair of elongated holes (2a) that extend so as to avoid the first wiring films (4A) and the second wiring films (4B) on the periphery of the first heat sensitive element (3A) and the second heat sensitive element (3B), heat conduction from an infrared absorption region on the first heat sensitive element (3A) to the surrounding environment is blocked by the elongated holes (2a), so that radiation heat from the measurement object S can be thermally isolated for efficient accumulation. In order to prevent temperature distribution from being disturbed by radiation heat from the measurement object S, heat conduction from a portion which is thermally affected by a peripheral device is blocked by the elongated holes (2a) so that the effects of heat conduction can be suppressed.

Since the first wiring film (4A) is arranged around the first heat sensitive element (3A) and is formed to have a larger area than that of the second wiring film (4B), the first wiring film (4A) improves heat collection from a portion of the insulating film (2) at which infrared radiation has been absorbed and a heat capacity of the first wiring film (4A) becomes close to that of a portion in which the infrared reflection film (6) is formed on the insulating film (2), resulting in a reduction in variation error.

Next, a description will be given below of an infrared sensor according to a second embodiment of the present invention with reference to FIG. 6. In the description of the following embodiment, the same components described in the above embodiment are designated by the same reference numerals and a duplicated explanation will be omitted.

Figure 6:
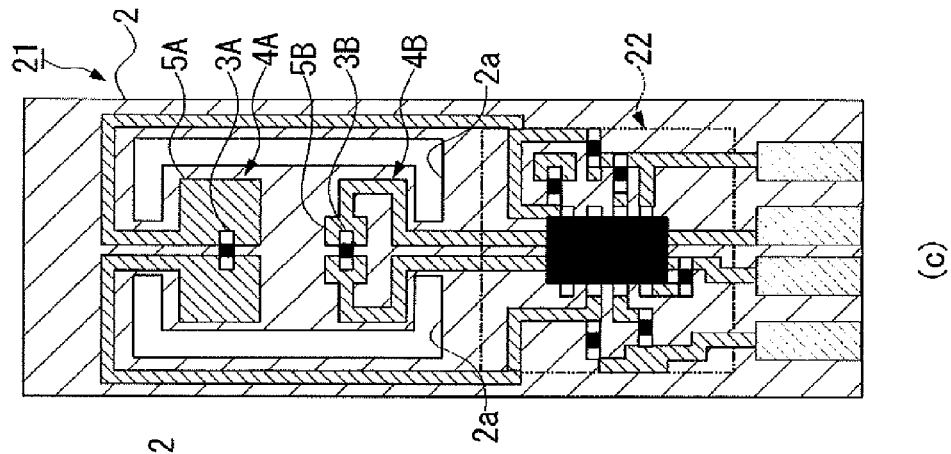
FIG. 6(a) is a rear view illustrating an infrared sensor according to a second embodiment of the present invention.
FIG. 6(b) is a front view illustrating the infrared sensor according to the second embodiment of the present invention.
FIG. 6(c) is a rear view illustrating the infrared sensor of the second embodiment with a reinforcing plate being removed therefrom.
Figure 6:
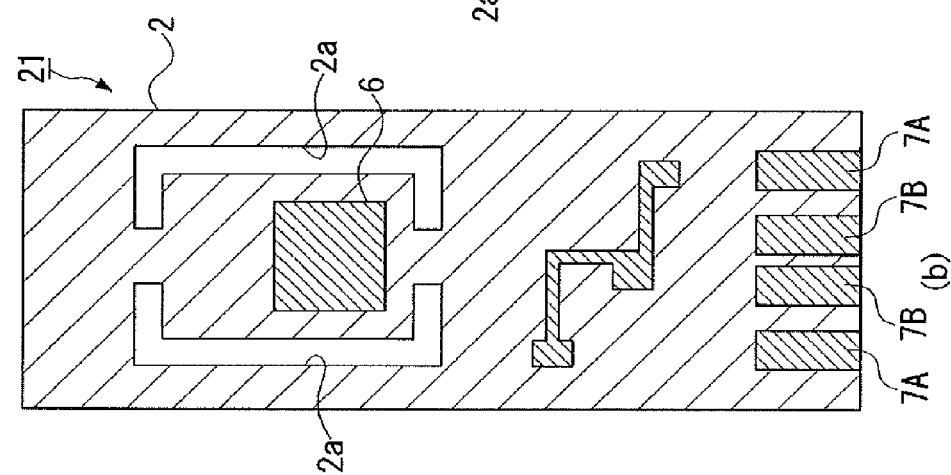
Figure 6:
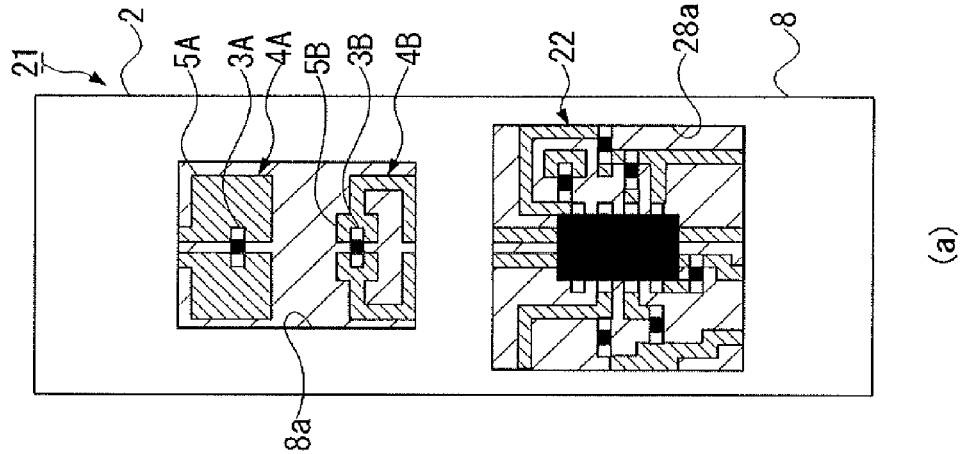
Figure 7:
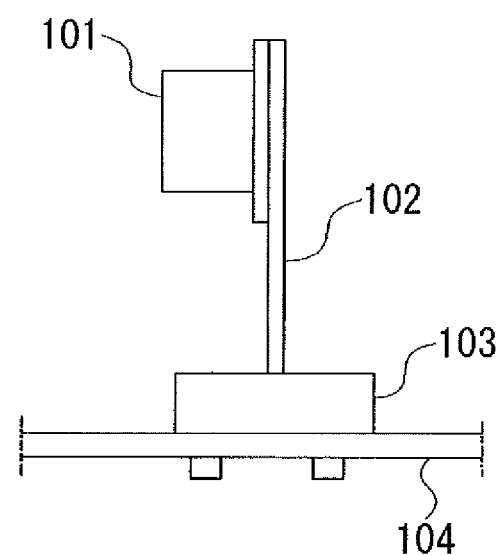
FIG. 7 is a side view illustrating a thermopile erected on a substrate according to a reference example of the present invention.

The second embodiment differs from the first embodiment in that, while only one sensor part having the first heat sensitive element (3A) and the second heat sensitive element (3B) is provided on the insulating film (2) in the first embodiment, the infrared sensor (21) of the second embodiment is integrally provided with not only the sensor part but also the circuit part (22) which is a detection circuit for sensor control connected to the sensor part on the insulating film (2) as shown in FIG. 6.

The second embodiment also differs from the first embodiment in that a circuit part window (28b) of rectangular shape corresponding to the circuit part (22) is formed in a reinforcing plate (28). Note that the sealing member (10) is omitted from illustration in FIG. 6.

As described above, the infrared sensor (21) of the second embodiment includes the circuit part (22) that is formed on the insulating film (2) and is connected to the first wiring films (4A) and the second wiring films (4B) and the first terminal electrodes (7A) and the second terminal electrodes (7B). The circuit part (22) is, for example, a temperature detection circuit constituted by an operation amplifier or the like.

Thus, since the infrared sensor (21) of the second embodiment includes the circuit part (22) that is formed on the insulating film (2) and is connected to the first wiring films (4A) and the second wiring films (4B), the sensor part and the circuit part (22) such as a detection circuit for the sensor part or the like are integrally formed on the same film, resulting in a reduction in size and costs of the entire device.

A space is formed by the circuit part window (28b) in a region corresponding to the circuit part (22) so that the reinforcing plate (28) does not obstruct mounting of an electronic component such as an operation amplifier or the like.

Furthermore, heat generated by an operation amplifier or the like of the circuit part (22) is blocked by the elongated holes (2a) so as to prevent the heat from being conducted to the first heat sensitive element (3A) and the second heat sensitive element (3B), the effects of heat generated by the circuit part (22) on temperature detection can be suppressed.

The technical scope of the present invention is not limited to the aforementioned embodiments and Examples, but the present invention may be modified in various ways without departing from the scope or teaching of the present invention.

For example, while, in the above embodiments, the first heat sensitive element detects the heat conducted from the insulating film that has directly absorbed infrared radiation, an infrared absorbing film may also be formed on the insulating film directly above the first heat sensitive element. In this case, the infrared absorption effect obtained by the first heat sensitive element further improves, so that a favorable temperature difference can be obtained between the first heat sensitive element and the second heat sensitive element. Specifically, infrared radiation from the measurement object may be absorbed by the infrared absorbing film so that the temperature of the first heat sensitive element directly below the insulating film may be changed by heat conduction via the insulating film from the infrared absorbing film generated heat by infrared absorption.

The infrared absorbing film is formed of a material having a higher infrared absorptivity than that of the insulating film. As the infrared absorbing film, a film containing an infrared absorbing material such as carbon black or the like or an infrared absorbing glass film (borosilicate glass film containing 71% silicon dioxide or the like) may be employed. In particular, it is preferable that the infrared absorbing film is an antimony-doped tin oxide (ATO) film. The ATO film exhibits excellent infrared absorptivity and excellent light resistance as compared with carbon black or the like. Also, the ATO film is cured by ultraviolet light so that strong bonding strength is obtained and the ATO film is not easily peeled off as compared with carbon black or the like.

It is preferable that the infrared absorbing film is formed to have a larger area than that of the first heat sensitive element so as to cover the first heat sensitive element.

While a chip thermistor is employed as each of the first heat sensitive element and the second heat sensitive element, a thin-film thermistor may also be employed as each of the first heat sensitive element and the second heat sensitive element.

As described above, although a thin-film thermistor or a chip thermistor is used as a heat sensitive element, a pyroelectric element or the like may also be employed other than a thermistor.

REFERENCE NUMERALS 1, 21: infrared sensor, 2: insulating film, 2a: elongated hole, 3A: first heat sensitive element, 3B: second heat sensitive element, 4A: first wiring film, 4B: second wiring film, 5A: first terminal electrode, 5B: second terminal electrode, 6: infrared reflection film, 7A: first terminal electrode, 7B: second terminal electrode, 8, 28: reinforcing plate, 8a: sensor part window, 9: connector, 22: circuit part, 28b: circuit part window

What is claimed is:
1. An infrared sensor comprising:
   an insulating film;
   a first heat sensitive element and a second heat sensitive element that are disposed on one surface of the insulating film so as to be separated apart from one another;
   a first conductive wiring film and a second conductive wiring film that are formed on one surface of the insulating film and are respectively connected to the first heat sensitive element and the second heat sensitive element;
   an infrared reflection film that is disposed on the other surface of the insulating film so as to face the second heat sensitive element;
   a reinforcing plate on which a sensor part window corresponding to the region of the first heat sensitive element, the second heat sensitive element, and the infrared reflection film is formed and which is adhered to one surface of the insulating film;
   a plurality of terminal electrodes that are respectively connected to the first conductive wiring film and the second conductive wiring film, are formed on the edge of the other surface of the insulating film, and are capable of being fitted into a external connector, and
   a sealing member adhered to the reinforcing plate, which sealing member is for sealing the sensor part window and can reflect infrared radiation from outside;
   wherein the reinforcing plate extends to a region facing the terminal electrodes.
2. The infrared sensor according to claim 1, further comprising:
   a circuit part that is formed on the insulating film,
   wherein a circuit part window corresponding to the circuit part is formed in the reinforcing plate.
3. The infrared sensor according to claim 1, wherein the first conductive wiring film is arranged around the first heat sensitive element and is formed to have a larger area than that of the second wiring film.

* * * * *